US012681041B2

(12) United States Patent　(10) Patent No.:　US 12,681,041 B2
Law et al.　(45) Date of Patent:　Jul. 14, 2026

(54) SOCKET AND INSPECTION SOCKET

(71) Applicant: Enplas Corporation, Saitama (JP)

(72) Inventors: Rui Zhi Law, Singapore (SG); Ryuichi Kaneko, Saitama (JP)

(73) Assignee: Enplas Corporation, Saitama (JP)

( * ) Notice: Subject to any disclaimer, the term of this patent is extended or adjusted under 35 U.S.C. 154(b) by 371 days.

(21) Appl. No.: 18/455,952

(22) Filed: Aug. 25, 2023

(65) Prior Publication Data

US 2025/0067773 A1　Feb. 27, 2025

(51) Int. Cl.
*G01R 1/04*　(2006.01)
*H01R 12/70*　(2011.01)
*H01R 12/71*　(2011.01)
*H01R 12/72*　(2011.01)
*H01R 13/05*　(2006.01)
*H01R 13/424*　(2006.01)

(52) U.S. Cl.
CPC ..........　*G01R 1/045* (2013.01); *G01R 1/0466* (2013.01); *G01R 1/0483* (2013.01); *H01R 12/7076* (2013.01); *H01R 12/714* (2013.01); *H01R 12/727* (2013.01); *H01R 13/057* (2013.01); *H01R 13/424* (2013.01); *H01R 2201/20* (2013.01)

(58) Field of Classification Search
CPC .... G01R 1/045; G01R 1/0466; G01R 1/0483;

G01R 1/06722; G01R 1/0433; G01R 31/2896; H01R 12/7076; H01R 12/714; H01R 12/727; H01R 13/057; H01R 13/424; H01R 2201/20; H01R 13/40; H01R 12/58; H01R 12/71; H01R 13/652
See application file for complete search history.

(56)　References Cited

U.S. PATENT DOCUMENTS 8,758,066　B2　6/2014　Zhou
2007/0145991　A1 *　6/2007　Yoshida ................. G01R 1/045
324/755.01

* cited by examiner

*Primary Examiner* — Joseph Ortega
(74) *Attorney, Agent, or Firm* — Shih IP Law Group, PLLC

(57)　ABSTRACT

A socket includes: a base portion that includes a first and a second base portions both electrically conductive and assembled so as to overlap each other in an upper-lower direction, the base portion being provided with a through hole penetrating through the first and the second base portions in the upper-lower direction; and a contact pin that is inserted into the through hole, in which the base portion holds the contact pin through an insulation member in the through hole of the first base portion, includes a first step in which a diameter on a side of the second base portion is smaller than that on a side of the first base portion at a boundary portion between the through hole of the first base portion and the through hole of the second base portion, and restricts downward movement of the insulation member with the first step.

8 Claims, 2 Drawing Sheets

SOCKET AND INSPECTION SOCKET

TECHNICAL FIELD

The present invention relates to a socket and an inspection socket.

BACKGROUND ART

An IC socket has been known as a socket for electrically connecting an electric component such as an IC package packaging an integrated circuit (IC) to an external electric component (e.g., wiring board), for example. The IC socket is used, for example, to inspect electric properties of the IC package when shipping inspection is performed on the IC package.

The IC socket includes a contact pin in the base portion for electrically connecting the IC package and the wiring board together, the IC package is mounted on the base portion on the upper surface side, and the wiring board is attached to the base portion on the lower surface side. The contact pin is provided so as to penetrate the base portion, the upper end of the contact pin is electrically connected to a terminal of the IC package, and the lower end thereof is electrically connected to a terminal of the wiring board (e.g., see Patent Literature (hereinafter, referred to as PTL) 1).

Some IC sockets include coaxial contact pins. These IC sockets are configured so that through holes are provided in a ground-connected metal base portion, and into the through holes, contact pins for signal transmission are inserted through insulation members (e.g., see PTL 1). Thus, the contact pins form a coaxial line with the inner wall surface of the through holes in the metal base portion.

CITATION LIST

Patent Literature

PTL 1

U.S. Pat. No. 8,758,066

SUMMARY OF INVENTION

Technical Problem

However, in the above-described conventional IC socket, when the contact pin receives a pressing force or another external force in the vertical direction, the insulation member receives a load from the contact pin and is possibly displaced, for example. In such a case, holding of the contact pin by the base portion through the insulation member possibly becomes unstable.

An object of the present invention is to provide a socket and an inspection socket each capable of stabilizing holding of a contact pin in a through hole of a base portion.

Solution to Problem

One aspect of a socket according to the present invention includes:

a base portion that includes a first base portion and a second base portion both electrically conductive and assembled so as to overlap each other in an upper-lower direction, the base portion being provided with a through hole penetrating through the first base portion and the second base portion in the upper-lower direction; and a contact pin that is inserted into the through hole and is connected to a terminal of a first electric component at an upper end and to a terminal of a second electric component at a lower end when in use to electrically connect the first electric component and the second electric component together, in which the base portion holds the contact pin through an insulation member in the through hole of the first base portion, includes a first step in which a diameter on a side of the second base portion is smaller than that on a side of the first base portion at a boundary portion between the through hole of the first base portion and the through hole of the second base portion, and restricts downward movement of the insulation member with the first step.

One aspect of an inspection socket according to the present invention is an inspection socket used for inspecting electric properties of a first electric component, and includes the above-described socket.

Advantageous Effects of Invention

According to the present invention, it is possible to prevent displacement and/or detachment of an insulation member used for holding a contact pin in a through hole of a base portion.

DESCRIPTION OF EMBODIMENTS

Hereinafter, an embodiment of the present invention will be described in detail with reference to the accompanying drawings.

In the present embodiment, an inspection socket for an inspection apparatus that inspects electric properties of an electric component will be exemplified as a socket. This inspection apparatus performs various tests on electric components to be inspected. For example, the apparatus checks whether an electric component appropriately operates in the same environment as the actual use environment of the electric component or in an environment where a load greater than that in the actual environment is applied.

Further, the socket according to the present embodiment is an IC socket whose inspection target is an IC package, but an electric component to be inspected by the socket may be an electric component different from the IC package. The IC is an electronic circuit and includes transistors, resistances, capacitors, and inductors interconnected on a silicon substrate, for example.

Figure 1:
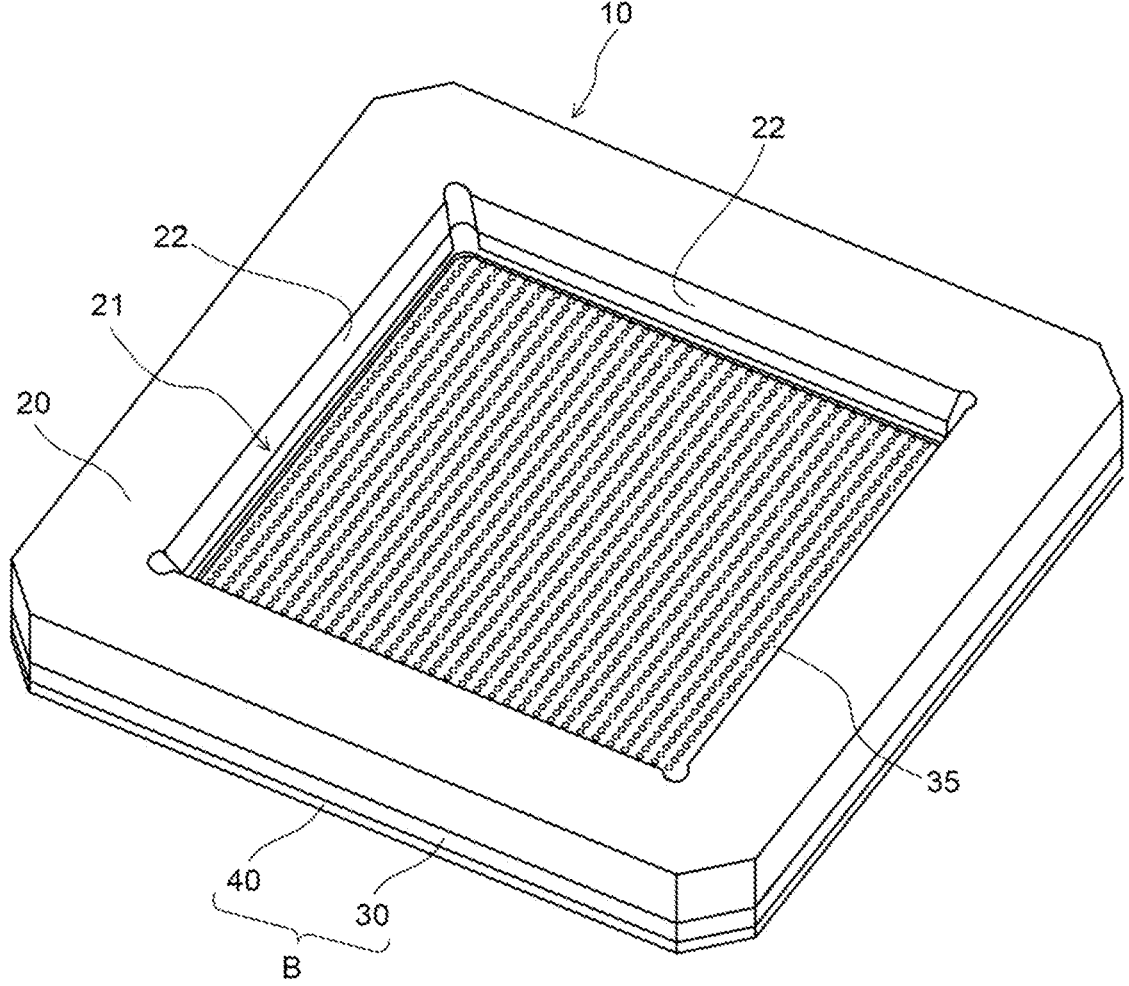
FIG. 1 is a perspective view of a socket according to an embodiment of the present invention, and illustrates an upper surface side of the socket.
Figure 2:
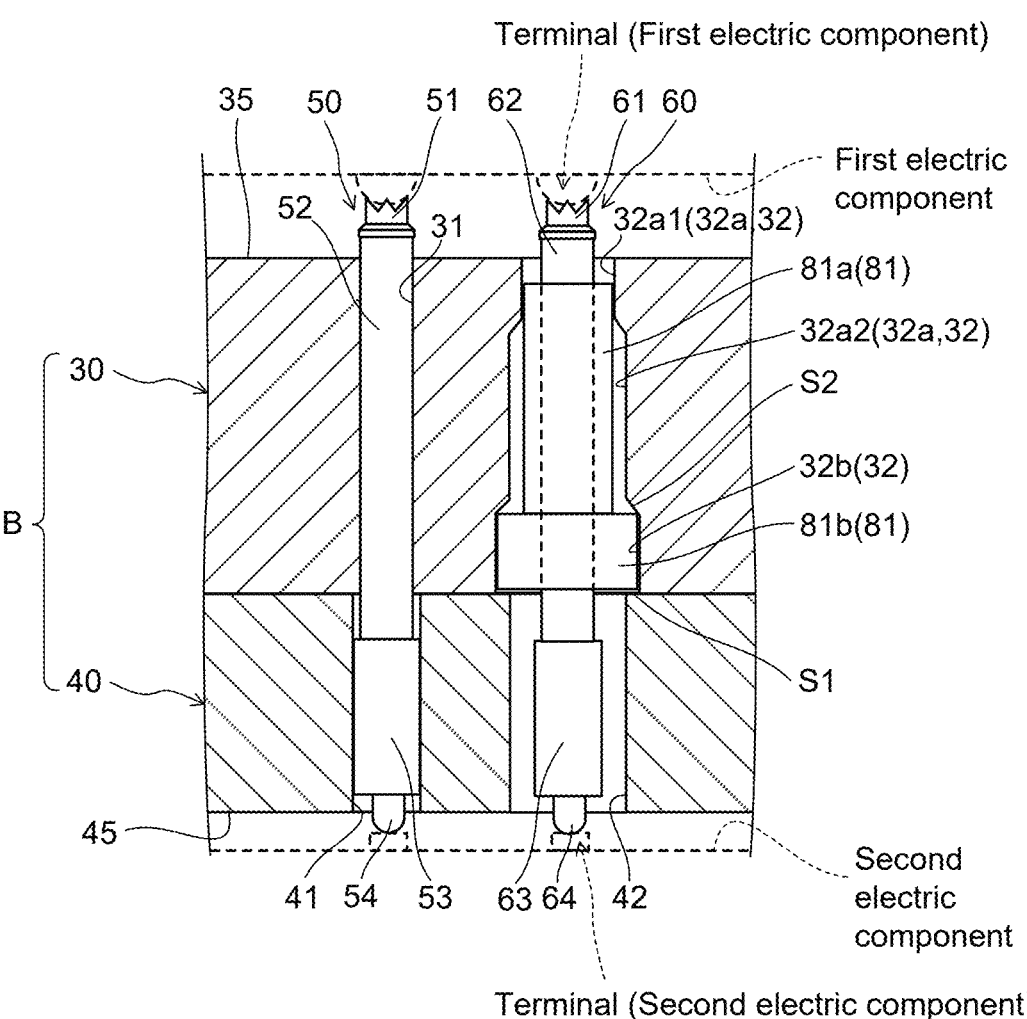
FIG. 2 is a cross-sectional view of a base portion of the socket illustrated in FIG. 1.

FIG. 1 is a perspective view of IC socket 10 according to the present embodiment, and illustrates an upper surface side of IC socket 10. FIG. 2 is a cross-sectional view of base portion B of IC socket 10 illustrated in FIG. 1.

(IC Socket)

IC socket 10 includes base portion B and frame portion 20. Note that, in the present embodiment, a thickness direction of base portion B is referred to as an upper-lower direction, and in the following description, the terms "upper" and "lower" will indicate upper and lower of this upper-lower direction.

Base portion B is a plate-shaped member having a thickness in the upper-lower direction. Base portion B has a rectangular shape in plan view in the present embodiment, but this shape is exemplary. Frame portion 20 is a member that is disposed on upper surface 35 of base portion B so as to surround the outer periphery of base portion B and that is fixed to base portion B. The inner side of frame portion 20 functions as housing portion 21 that houses an IC package (not illustrated) when IC socket 10 is used.

The IC package is placed on upper surface 35 of base portion B when in use. The IC package is an exemplary first electric component. In the present embodiment, an IC package of a Ball Grid Array (BGA) type, a Land Grid Array (LGA) type, or the like can be applied as the IC package.

A wiring board (not illustrated) is attached to the lower side of lower surface 45 of base portion B when in use. The wiring board is an exemplary second electric component. In the present embodiment, the wiring board is a wiring board of the inspection apparatus for performing the above-described various tests.

(Frame Portion)

Frame portion 20 is a frame body in which the central portion is opened in the upper-lower direction and the opening portion is surrounded by frame portion 20, and constitutes an outer peripheral portion of housing portion 21. In the present embodiment, the shape of the opening portion is a rectangular shape, but can be appropriately changed depending on the shape of the IC package to be housed.

On the inner peripheral side of frame portion 20, that is, on the inner wall of housing portion 21, guide portion 22 for guiding the IC package to the correct position in housing portion 21 is provided. Since a known technique can be applied as guide portion 22 guiding the IC package to the correct position in housing portion 21, the detailed description is omitted herein.

The IC package is guided by guide portion 22 to the correct position in housing portion 21. The IC package housed in housing portion 21 is pressed downward by a pressing member (not illustrated) or the like. By this pressing, terminals of the IC package, such as solder balls, come into contact with upper plungers 51 and 61 of contact pins 50 and 60 (to be described later) placed in base portion B.

Further, the wiring board is attached to the lower surface of base portion B (lower surface 45 of lower base portion 40) so that the terminals of the wiring board is in contact with lower plungers 54 and 64 of contact pins 50 and 60 placed in base portion B.

Thus, IC socket 10 electrically connects terminals of the IC package housed in housing portion 21 and terminals of the wiring board attached to the lower surface of base portion B with each other by housing the IC package in housing portion 21 and pressing the IC package downward.

(Base Portion)

Base portion B includes upper base portion 30 on the IC package side and lower base portion 40 on the wiring board side. Upper base portion 30 and lower base portion 40 are each a planar member having a predetermined thickness. In the thickness direction of base portion B, upper base portion 30 is placed on the upper side where the IC package is housed, and lower base portion 40 is placed on the lower side where the wiring board is attached.

Upper base portion 30 placed on the upper side constitutes a bottom portion of housing portion 21, and upper surface 35 of upper base portion 30 serves as a bottom surface of housing portion 21.

That is, in the present embodiment, base portion B is a two-layer laminated structure configured by placing upper base portion 30 (example of first base portion) and lower base portion 40 (example of second base portion) so as to overlap each other in the upper-lower direction. However, as a variation, another planar member having a predetermined thickness similarly to upper base portion 30 and lower base portion 40 may be further laminated over upper base portion 30 and/or under lower base portion 40 as a part of base portion B.

Upper base portion 30 includes through holes 31 and 32 penetrating in the upper-lower direction. The upper side of contact pin 50 is inserted into through hole 31 and placed so that the end portion of upper plunger 51 is exposed above upper surface 35. Contact pin 50 may be, for example, a contact pin for grounding (hereinafter, referred to as a ground pin).

The upper side of contact pin 60 is inserted into through hole 32 through insulation sleeve 81 to be described later and placed so that the end portion of upper plunger 61 is exposed above upper surface 35. Insulation sleeve 81 is placed in through hole 32. Thus, through hole 32 includes a part having a larger diameter than through hole 31, which will be described in detail later. Contact pin 60 may be, for example, a contact pin for signal transmission (hereinafter, referred to as a signal pin) or a contact pin for power supply. In the following description, contact pin 60 will be referred to as signal pin 60, taking a signal pin as an example.

Note that, in FIG. 2, one ground pin 60 and through hole 31 and one signal pin 50 and through hole 32 are illustrated, but they are disposed corresponding to the number, arrangement, and/or the like of terminals of the IC package.

Upper base portion 30 is formed of a material having electrical conductivity, and is typically formed of metal such as aluminum. Ground pin 50 is inserted into through hole 31 and placed so that upper barrel 52, which will be described later, is in contact with the inner wall surface of through hole 31. On the inner wall surface of through hole 31, the metal constituting upper base portion 30 is exposed, so that ground pin 50 is electrically connected to upper base portion 30 to keep ground potential of upper base portion 30.

The metal constituting upper base portion 30 is also exposed on the inner wall surface of through hole 32, but signal pin 60 is inserted into through hole 32 through insulation sleeve 81. This configuration can avoid contact of upper barrel 62 to be described later with the inner wall surface of through hole 32, and can prevent a short circuit between signal pin 60 and upper base portion 30. Further, this configuration forms a coaxial line between upper barrel 62 to be described later and the inner wall surface of through hole 32. This coaxial line provides an impedance-matched signal path and allows transmission of high-frequency electric signals, which can increase a data-transfer rate in IC socket 10.

Similarly to upper base portion 30, lower base portion 40 is also formed of a material having electrical conductivity, and is typically formed of metal such as aluminum. Further, similarly to upper base portion 30, lower base portion 40 includes through holes 41 and 42 penetrating in the upper-lower direction. Through hole 41 is paired with through hole 31 of upper base portion 30 to form one through hole penetrating base portion B. Similarly, through hole 42 is paired with through hole 32 of upper base portion 30 to form one through hole penetrating base portion B.

Through holes 41 and 42 are disposed corresponding to the number, arrangement, and/or the like of through holes 31 and 32 of upper base portion 30, that is, corresponding to the number, arrangement, and/or the like of terminals of the IC package. Then, ground pin 50 is disposed in through holes 31 and 41, and signal pin 60 is disposed in through holes 32 and 42.

The lower side of ground pin 50 is inserted into through hole 41 and placed so that the end portion of lower plunger 54 is exposed below lower surface 45.

The lower side of ground pin 60 is inserted into through hole 42 and placed so that the end portion of lower plunger 64 is exposed below lower surface 45.

Ground pin 50 is inserted into through hole 41 and placed so that lower barrel 53, which will be described later, is in contact with the inner wall surface of through hole 41.

(Shape of Through Hole)

Through holes 32 and 42 into which signal pin 60 is inserted have large inner diameters over the entire length in the upper-lower direction, compared with through holes 31 and 41 into which ground pin 50 is inserted. That is, signal pin 60 has a smaller diameter than through holes 32 and 42 over the entire length in the upper-lower direction. Thus, in a case where signal pin 60 having the same diameter as ground pin 50 is used, signal pin 60 can be held so as not to be in contact with the inner walls of through holes 31 and 41 by interposing insulation member 81 between signal pin 60 and the inner wall of through hole 31.

In the present embodiment, through hole 32 is structured so that the inner diameter of through hole 32 is not uniform and changes in stages (in three steps in the present embodiment) in the upper-lower direction.

Specifically, through hole 32 is structured so that the diameter of distal portion 32a located on the distal side (that is, upper side) relatively apart from a boundary portion of through holes 32 and 42 is reduced from that of proximal portion 32b located on the proximal side (that is, lower side) relatively closer to the boundary portion. Proximal portion 32b, which is larger in diameter than distal portion 32a, is also larger in diameter than through hole 42 of lower base portion 40. Therefore, a step (hereinafter, referred to as "first step S1") is formed at the boundary portion of through holes 32 and 42. Further, the reduction in the diameter of distal portion 32a with respect to proximal portion 32b forms a step (hereinafter, referred to as "second step S2") between distal portion 32a and proximal portion 32b.

The diameter of distal portion 32a becomes smaller at an end portion on the side of upper surface 35. That is, distal portion 32a includes small-diameter portion 32a1 having a relatively small inner diameter in the upper end portion and large-diameter portion 32a2 having a relatively large inner diameter below small-diameter portion 32a1. In the present embodiment, the inner diameter of large-diameter portion 32a is the same as the inner diameter of through hole 42 of lower base portion 40.

(Contact Pin)

Terminals of the IC package are electrically connected to terminals of the wiring board through ground pin 50 and signal pin 60 respectively disposed in through holes 31 and 41 and through holes 32 and 42 of base portion B (upper base portion 30 and lower base portion 40).

Ground pin 50 electrically connects a ground terminal of the IC package and a ground terminal of the wiring board together. Ground pin 50 includes upper plunger 51, upper barrel 52, lower barrel 53, lower plunger 54, a spring (not illustrated), and the like.

Upper barrel 52 is a cylindrical member extending in the upper-lower direction along through hole 31. The lower end portion of upper plunger 51 is inserted and fixed inside the upper end portion of upper barrel 52.

The upper end portion of upper plunger 51 is formed depending on the shape of the terminal of the IC package. For example, when the terminal is a solder ball, the upper end portion is formed in a crown shape as illustrated in FIG. 2, and the solder ball makes contact with the inner side of the crown shape portion.

Lower barrel 53 is a cylindrical member extending in the upper-lower direction along through hole 41 and is connected to the lower end portion of upper barrel 52. Lower barrel 53 has a diameter larger than that of upper barrel 52 and houses a spring that biases lower plunger 54 downward. The upper end portion of lower plunger 54 is inserted inside the lower end portion of lower barrel 53 to be slidably held.

The lower end portion of lower plunger 54 is formed depending on the shape of the terminal of the wiring board. For example, when the terminal is a pad, the lower end portion is formed in a hemispherical shape as illustrated in FIG. 2, and the pad makes contact with the tip portion of the hemispherical shape.

In ground pin 50, upper plunger 51, upper barrel 52, lower barrel 53, and lower plunger 54 are each formed of metal having electrical conductivity, and electrically connect the terminal of the IC package and the terminal of the wiring board together. For example, upper barrel 52 and lower barrel 53 are formed of a metal base-material, and a gold coating is formed on their surfaces. The coating is preferably metal inert toward oxygen, and is further preferably metal having a low resistance value, for example, gold, which is a noble metal, but may be any other equivalent metal.

Therefore, lower barrel 53 comes into contact with the inner wall surface of through hole 41 in ground pin 50. The contact of lower barrel 53 with the inner wall surface of through hole 41 electrically connects lower barrel 53 and the inner wall with each other, and ground potential of lower base portion 40 can be kept.

Signal pin 60 electrically connects a signal terminal for signal transmission different from the ground terminal in the IC package and a signal terminal for signal transmission different from the ground terminal in the wiring board together. Similarly to ground pin 50, signal pin 60 includes upper plunger 61, upper barrel 62, lower barrel 63, lower plunger 64, a spring (not illustrated), and the like.

In the present embodiment, signal pin 60 is configured similarly to ground pin 50. Thus, detailed description thereof is omitted, but signal pin 60 is placed in through hole 32 while insulation sleeve 81 formed of an insulation material is placed on the outer periphery of signal pin 60.

Note that ground pin 50 and signal pin 60 illustrated in FIG. 2 are exemplary, and the shapes and sizes thereof can be appropriately changed depending on the shape and size of the terminal of the IC package, for example.

(Shape of Insulation Sleeve and Relationship Between Insulation Sleeve and Through Hole)

As illustrated in FIG. 2, insulation sleeve 81 (example of insulation member) is placed on the outer periphery of upper barrel 62. This avoids contact of signal pin 60 with through holes 32 and 42. Further, insulation sleeve 81 placed in through hole 32 holds signal pin 60 inserted into the inner through hole. This allows base portion B to hold signal pin 60 through insulation sleeve 81 so that signal pin 60 does not come off through holes 32 and 42.

In the present embodiment, insulation sleeve 81 is a cylindrical body that extends in the upper-lower direction and that can surround most of the outer periphery of upper barrel 62. Unlike the conventional configuration in which two ring-shaped insulation members not extending in the upper-lower direction are disposed at two upper and lower positions, for example, as described in PTL 1, insulation sleeve 81 surrounds most of signal pin 60 in the upper-lower direction as a single unit (single component), so that insulation sleeve 81 can firmly hold signal pin 60. Therefore, occurrence of relative displacement between insulation sleeve 81 and signal pin 60 can be suppressed when a pressing force or an external force acts on signal pin 60.

Incidentally, attachment and detachment of insulation sleeve 81 to and from through hole 32 can be easily performed in a state where base portion B is disassembled, that is, in a state where upper base portion 30 and lower base portion 40 are separated from each other. In the present embodiment, insulation sleeve 81 used for one signal pin 60 is a single component and is easily attached to base portion B: therefore, signal pin 60 and/or insulation sleeve 81 can be easily replaced. This can enhance maintainability of IC socket 10.

Insulation sleeve 81 includes cylindrical body portion 81a extending in the upper-lower direction and annular protruding portion 81b (example of protruding portion) located at the lower end portion of cylindrical body portion 81a and having a larger diameter than, that is, protruding outward from, cylindrical body portion 81a.

Annular protruding portion 81b is in a state of being placed in proximal portion 32b of through hole 32 as described above. Thus, the outer diameter of annular protruding portion 81b is larger than the inner diameter of through hole 42 of lower base portion 40. Therefore, the lower surface of the outer edge portion of annular protruding portion 81b is in contact with first step S1 located at the boundary portion of through holes 32 and 42. Consequently, base portion B can support annular protruding portion 81b from a lower side with first step S1. This supporting structure restricts downward movement of insulation sleeve 81.

Further, the outer diameter of annular protruding portion 81b is larger than the inner diameter of large-diameter portion 32a2 in distal portion 32a of through hole 32. Thus, the upper surface of the outer edge portion of annular protruding portion 81b is in contact with second step S2 located at the boundary portion of distal portion 32a and proximal portion 32b. Consequently, base portion B can support annular protruding portion 81b from an upper side with second step S2. This supporting structure restricts upward movement of insulation sleeve 81.

Summary

As described above, in the present embodiment, IC socket 10 includes at least base portion B and signal pin 60. Base portion B includes upper base portion 30 and lower base portion 40. Upper base portion 30 and lower base portion 40 are both electrically conductive and are assembled so as to overlap each other in the upper-lower direction. Through holes 32 and 42 are provided in upper base portion 30 and lower base portion 40 so as to penetrate upper base portion 30 and lower base portion 40 in the upper-lower direction. Signal pin 60 is inserted into through holes 32 and 42, and, when in use, connected to a terminal of an IC package at the upper end and to a terminal of a wiring board at the lower end, which electrically connects the IC package and the wiring board together. Base portion B holds signal pin 60 through insulation sleeve 81 in through hole 31 of upper base portion 30. Base portion B includes first step S1 in which the diameter on the side of lower base portion 40 is reduced from that on the side of upper base portion 30 at the boundary portion of through hole 31 of upper base portion 30 and through hole 41 of lower base portion 40, and restricts downward movement of insulation sleeve 81 with first step 1. This configuration can suppress downward displacement of insulation sleeve 81 even when insulation sleeve 81 receives a load from signal pin 60 when a pressing force or another external force in the upper-lower direction acts on signal pin 60. Therefore, holding of signal pin 60 can be stabilized in through holes 32 and 42 of base portion B.

Furthermore, base portion B includes, in through hole 31 of upper base portion 30, second step S2 in which the diameter on the distal side apart from the boundary portion of through hole 31 of upper base portion 30 and through hole 41 of lower base portion 40 is smaller than that on the proximal side closer to the boundary portion. Base portion B restricts upward movement of insulation sleeve 81 with second step S2. This configuration can suppress upward displacement of insulation sleeve 81 even when insulation sleeve 81 receives a load from signal pin 60 when a pressing force or another external force in the upper-lower direction acts on signal pin 60. Therefore, holding of signal pin 60 can be further stabilized in through holes 32 and 42 of base portion B.

Further, base portion B supports insulation sleeve 81 from the lower side with first step S1, and supports insulation sleeve 81 from the upper side with second step S2. Base portion B can hold insulation sleeve 81 according to this configuration. Therefore, even when insulation sleeve 81 receives a load from signal pin 60 caused by a pressing force or an external force, displacement of insulation sleeve 81 can be reliably suppressed.

Further, insulation sleeve 81 is a cylindrical member extending in the upper-lower direction and surrounding the outer surface of signal pin 60, and the cylindrical body includes annular protruding portion 81b that protrudes outward in a part of the body in the upper-lower direction and that is in contact with first step S1 and/or second step S2. According to this configuration, insulation sleeve 81 surrounds most of signal pin 60 in the upper-lower direction as a single unit (single component), and thus can hold signal pin 60. Therefore, occurrence of relative displacement between insulation sleeve 81 and signal pin 60 can be suppressed when a pressing force or an external force acts on signal pin 60. Then, by base portion B firmly holding insulation sleeve 81 and by insulation sleeve 81 holding signal pin 60, displacement of or coming off signal pin 60 can be avoided.

Further, insulation sleeve 81 includes annular protruding portion 81b in the lower end portion thereof. Through hole 32 includes small-diameter portion 32a1 whose diameter is reduced from that of second step S2, at a position on the upper side with respect to second step S2 on the distal side of upper base portion 30. That is, base portion B holds insulation sleeve 81 at two positions spaced apart from each other in the upper-lower direction, which can stably keep the standing posture of signal pin 60 in the upper-lower direction.

Although the embodiment of the present invention has been described in detail, the present invention is not limited to the specific embodiment described above. Various changes and modifications can be made to the specific examples described in the above embodiment within the scope of the gist of the present invention described in the claims.

INDUSTRIAL APPLICABILITY

A socket and an inspection socket according to the present disclosure are each suitable for an IC socket for housing an electric component such as an IC package on a wiring board, for example. In particular, the socket and the inspection socket are suitable in a case where high-frequency electric signals are transmitted to increase a data-transfer rate in the IC package and the wiring board.

REFERENCE SIGNS LIST

10 IC socket
20 Frame portion
21 Housing portion
22 Guide portion
30 Upper base portion
31, 32 Through hole
32*a* Distal portion
32*a*1 Small-diameter portion
32*a*2 Large-diameter portion
32*b* Proximal portion
35 Upper surface
40 Lower base portion
41, 42 Through hole
45 Lower surface
50, 60 Contact pin
51, 61 Upper plunger
52, 62 Upper barrel
53, 63 Lower barrel
54, 64 Lower plunger
81 Insulation sleeve
81*a* Cylindrical body portion
81*b* Annular protruding portion
B Base portion
S1 First step
S2 Second step

The invention claimed is:

1. A socket, comprising:
a base portion that includes an upper base portion and a lower base portion both electrically conductive and assembled so as to overlap each other in an upper-lower direction, the base portion being provided with a through hole penetrating through the upper base portion and the lower base portion in the upper-lower direction; and
a contact pin that is inserted into the through hole and is connected to a terminal of a first electric component at an upper end and to a terminal of a second electric component at a lower end when in use to electrically connect the first electric component and the second electric component together,
wherein the base portion
holds the contact pin through an insulation member in the through hole of the upper base portion,
further includes a first stepped portion defined by a difference in diameter at a boundary portion between the through hole of the upper base portion and the through hole of the lower base portion, the difference in diameter being formed by a first diameter which is a diameter of the through hole at a bottom portion of the upper base portion and a second diameter which is a diameter of the through hole at a top portion of the lower base portion, and
restricts downward movement of the insulation member with the first stepped portion.

2. The socket according to claim 1, wherein the base portion
further includes, in the through hole of the upper base portion, a second stepped portion in which a diameter on a distal side apart from the boundary portion is reduced from a diameter on a proximal side close to the boundary portion, and
restricts upward movement of the insulation member with the second stepped portion.

3. The socket according to claim 2, wherein the base portion
supports the insulation member from a lower side with the first stepped portion,
supports the insulation member from an upper side with the second step stepped portion, and
supports the insulation member from an outer side with an inner wall of the through hole between the first stepped portion and the second stepped portion.

4. The socket according to claim 1, wherein
the contact pin is a pin for signal transmission or power supply,
the contact pin having a smaller diameter than the through hole over an entire length in the upper-lower direction, and
the contact pin being inserted so as not to be in contact with an inner wall of the through hole.

5. An inspection socket used for inspecting an electric property of a first electric component, the inspection socket comprising the socket according to claim 1.

6. A socket comprising:
a base portion that includes a first base portion and a second base portion both electrically conductive and assembled so as to overlap each other in an upper-lower direction, the base portion being provided with a through hole penetrating through the first base portion and the second base portion in the upper-lower direction; and
a contact pin that is inserted into the through hole and is connected to a terminal of a first electric component at an upper end and to a terminal of a second electric component at a lower end when in use to electrically connect the first electric component and the second electric component together, wherein:
the base portion
holds the contact pin through an insulation member in the through hole of the first base portion,
further includes a first stepped portion in which a diameter on a side of the second base portion is smaller than a diameter on a side of the first base portion at a boundary portion between the through hole of the first base portion and the through hole of the second base portion,
restricts downward movement of the insulation member with the first stepped portion,
further includes, in the through hole of the first base portion, a second stepped portion in which a diameter on a distal side apart from the boundary portion is reduced from a diameter on a proximal side close to the boundary portion, and
restricts upward movement of the insulation member with the second stepped portion, the insulation member is a cylindrical body extending in the upper-lower direction while surrounding an outer periphery of the contact pin, and the cylindrical body including a protruding portion that protrudes outward in a part of the cylindrical body in the upper-lower direction and that is in contact with the first-step stepped portion and/or the second-step stepped portion.

7. The socket according to claim 6, wherein the insulation member includes the protruding portion in an lower end portion, the through hole includes a small-diameter portion whose diameter is reduced from that of the second stepped portion, at a position on an upper side with respect to the second stepped portion on the distal side of the first base portion, and the base portion supports the insulation member from an outer side with an inner wall of the small-diameter portion.

8. An inspection socket used for inspecting an electric property of a first electric component, the inspection socket comprising the socket according to claim 6.

\*  \*  \*  \*  \*